United States Patent
Cheng et al.

(10) Patent No.: US 11,468,859 B2
(45) Date of Patent: Oct. 11, 2022

(54) ARRAY SUBSTRATE DRIVE CIRCUIT, DISPLAY MODULE AND DISPLAY DEVICE

(71) Applicants: BEIHAI HKC OPTOELECTRONICS TECHNOLOGY CO., LTD., Guangxi (CN); HKC CORPORATION LIMITED, Guangdong (CN)

(72) Inventors: Chiayang Cheng, Guangxi (CN); Wei Li, Guangxi (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/181,244

(22) Filed: Feb. 22, 2021

(65) Prior Publication Data
US 2022/0036846 A1    Feb. 3, 2022

(30) Foreign Application Priority Data
Jul. 28, 2020    (CN) .......................... 202010740611.5

(51) Int. Cl.
*G09G 3/36*    (2006.01)
*G09G 3/00*    (2006.01)

(52) U.S. Cl.
CPC .......... *G09G 3/3677* (2013.01); *G09G 3/006* (2013.01); *G09G 2310/0264* (2013.01)

(58) Field of Classification Search
CPC ................ G09G 3/3677; G09G 3/006; G09G 2310/0264
See application file for complete search history.

(56) References Cited

U.S. PATENT DOCUMENTS

2009/0058781 A1*  3/2009  Xu .......................... G11C 19/28
                                                                                345/92
2009/0135094 A1*  5/2009  Shibata ................ G09G 3/2927
                                                                                345/42
(Continued)

FOREIGN PATENT DOCUMENTS

CN            1800926 A        7/2006
CN          103500563 A        1/2014
(Continued)

OTHER PUBLICATIONS

Chinese Office Action dated Jul. 26, 2020, for Beihai HKC Optoelectronics Technology Co., Ltd et al., Chinese Application No. 202010740611.5, filed Jul. 28, 2020.

*Primary Examiner* — Michael A Faragalla
*Assistant Examiner* — Sujit Shah
(74) *Attorney, Agent, or Firm* — Law Offices of Albert Wai-Kit Chan, PLLC

(57) ABSTRACT

Disclosed are an array substrate drive circuit, a display module and a display device. The array substrate drive circuit includes: a signal driver configured for receiving a test signal, and generating a drive signal for driving a pixel array according to the test signal; and a signal isolator configured for dividing the drive signal into an even-numbered row drive signal and an odd-numbered row drive signal for driving the pixel array according to a preset control signal to drive the pixel array in rows. Since adjacent metal conductive layers will not output drive signals at the same time, even if the adjacent metal conductive layers are short-circuited, it can be detected during the test, thus improving the yield of the display panel.

17 Claims, 3 Drawing Sheets

(56) References Cited

U.S. PATENT DOCUMENTS

| | | | |
|---|---|---|---|
| 2010/0039361 A1* | 2/2010 | Hsu | G09G 3/3677 |
| | | | 345/92 |
| 2015/0269910 A1* | 9/2015 | Liao | G09G 5/18 |
| | | | 345/213 |
| 2018/0080973 A1 | 3/2018 | Zhang et al. | |
| 2018/0146143 A1* | 5/2018 | Derks | G01T 1/16 |
| 2019/0156725 A1* | 5/2019 | Hsu | G09G 3/2092 |

FOREIGN PATENT DOCUMENTS

| | | |
|---|---|---|
| CN | 106601174 A | 4/2017 |
| CN | 107015408 A | 8/2017 |
| WO | 2019242514 A1 | 12/2019 |

\* cited by examiner

ARRAY SUBSTRATE DRIVE CIRCUIT, DISPLAY MODULE AND DISPLAY DEVICE

CROSS REFERENCE TO RELATED APPLICATIONS

This disclosure claims the priority of Chinese Patent application with No. 202010740611.5, filed on Jul. 28, 2020 and entitled "Array Substrate Drive Circuit, Display Module and Display Device", which is hereby incorporated by reference in its entirety.

TECHNICAL FIELD

This disclosure relates to the technical field of electronic circuits, and in particular to an array substrate drive circuit, a display module and a display device.

BACKGROUND

The Gate Driver on Array (GOA) technology, as a representative of the new technology, is to integrate a gate switch circuit on a display substrate to remove a gate drive integrated circuit part.

Liquid Crystal Display (LCD) based on GOA technology has the advantages of simple manufacturing process and low cost, and has gradually become a mainstream display device. In the production process, the LCD needs to be equipped with a test circuit for Array Test (ATT). Due to the process of the GOA circuit in the production process and other reasons, short circuits between adjacent metal conductive layers are prone to occur. The ATT in the related technology cannot detect this type of short-circuit, resulting in a loss of product capacity and a low pass rate.

SUMMARY

The main object of this disclosure is to provide an array substrate drive circuit, a display module and a display device, aiming to reduce the defect rate of the display panel.

In order to achieve the above object, this disclosure provides an array substrate drive circuit, which includes:

a signal driver configured for receiving a test signal, and generating a drive signal for driving a pixel array according to the test signal; and a signal isolator configured for dividing the drive signal into an even-numbered row drive signal and an odd-numbered row drive signal for driving the pixel array according to a preset control signal to drive the pixel array in rows.

In an embodiment, the signal isolator includes even-numbered row isolation circuits and odd-numbered row isolation circuits;

controlled terminals of the even-numbered row isolation circuits are connected to even-numbered row output terminals of the signal driver in a one-to-one correspondence, output terminals of the even-numbered row isolation circuits are connected to even-numbered rows of the pixel array in a one-to-one correspondence, and input terminals of the even-numbered row isolation circuits are connected to each other; and controlled terminals of the odd-numbered row isolation circuits are connected to odd-numbered row output terminals of the signal driver in a one-to-one correspondence, output terminals of the odd-numbered row isolation circuits are connected to odd-numbered rows of the pixel array in a one-to-one correspondence, and input terminals of the odd-numbered row isolation circuits are connected to each other.

In an embodiment, the preset control signal includes a first control signal and a second control signal;

each odd-numbered row isolation circuit includes a first transistor; a gate of the first transistor is connected to a drain of the first transistor, the gate of the first transistor is connected to a corresponding odd-numbered row output terminal of the signal driver, and a source of the first transistor is connected to a corresponding odd-numbered row of the pixel array; the gate of the first transistor is further configured for receiving the first control signal.

In an embodiment, each even-numbered row isolation circuit includes a second transistor; a gate of the second transistor is connected to a drain of the second transistor, the gate of the second transistor is connected to a corresponding even-numbered row output terminal of the signal driver, and a source of the second transistor is connected to a corresponding even-numbered row of the pixel array; the gate of the second transistor is further configured for receiving the second control signal.

In an embodiment, the first transistor and the second transistor are both thin film transistors.

In an embodiment, the signal driver includes drive circuits, output terminals of odd-numbered row drive circuits are connected to the controlled terminals of the odd-numbered row isolation circuits in a one-to-one correspondence, and output terminals of even-numbered row drive circuits are connected to the controlled terminals of the even-numbered row isolation circuits in a one-to-one correspondence.

In an embodiment, the drive circuit is a gate driven on array drive circuit, and the drive circuit includes voltage phase-related CK signal, LC signal and frame start signal Vst, where the CK signal includes CK1, CK2, CK3 and CK4, and the LC signal includes LC1 and LC2.

In an embodiment, the gate driven on array drive circuit comprises 4 thin film transistors and 1 capacitor C.

In an embodiment, the signal isolator is configured for receiving a first control signal and a second control signal;

in response to receiving the first control signal by the signal isolator, outputting an odd-numbered row drive signal satisfying a first preset duty ratio; and in response to receiving the second control signal by the signal isolator, outputting an even-numbered row drive signal satisfying a second preset duty ratio.

In an embodiment, the array substrate drive circuit further includes a control chip;

where the control chip is configured for generating the first control signal or the second control signal in turn according to a preset cycle, and outputting the generated first control signal or the generated second control signal to the signal isolator.

In order to achieve the above object, this disclosure further provides a display module, which includes:

a control chip, including a test signal output terminal, a first control signal output terminal and a second control signal output terminal;

a display panel, including a display area and a non-display area, where the display area includes a pixel array; and the array substrate drive circuit according to any one of the above mentioned embodiments, where the array substrate drive circuit is provided in the non-display area of the display panel.

In order to achieve the above object, this disclosure further provides a display device including the display module as described above.

According to the technical solution of this disclosure, a signal driver and a signal isolator are provided to form an array substrate drive circuit. The signal driver generates a drive signal for driving a pixel array according to a test signal, and the signal isolator divides the drive signal into an even-numbered row drive signal and an odd-numbered row drive signal for driving the pixel array according to a preset control signal. The even-numbered row drive signal and the odd-numbered row drive signal respectively drive the pixel array in rows. Since adjacent metal conductive layers will not output drive signals at the same time, even if the adjacent metal conductive layers are short-circuited, it can be detected during the test, thus improving the yield of the display panel.

BRIEF DESCRIPTION OF THE DRAWINGS

In order to more clearly describe the technical solutions in the embodiments of this disclosure or the related art, the following will briefly introduce the drawings that need to be used in the description of the embodiments or the related art. Obviously, the drawings in the following description are only some embodiments of this disclosure. For those of ordinary skill in the art, without creative work, other drawings can be obtained according to the structures shown in these drawings.

Figure 1:
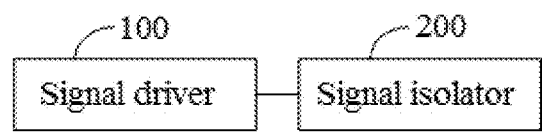
FIG. 1 is a diagram of functional module of an array substrate drive circuit according to an embodiment of this disclosure.

The realization of the object, functional characteristics, and advantages of this disclosure will be further described in conjunction with the embodiments and with reference to the accompanying drawings.

DETAILED DESCRIPTION OF THE EMBODIMENTS

The technical solutions in the embodiments of this disclosure will be described clearly and completely in conjunction with the drawings in the embodiments of this disclosure. Obviously, the described embodiments are only a part of the embodiments of this disclosure, but not all the embodiments. Based on the embodiments in this disclosure, all other embodiments obtained by those of ordinary skill in the art without making creative efforts fall within the protection scope of this disclosure.

It should be noted that if there is a directional indication (such as up, down, left, right, front, back . . . ) in the embodiment of this disclosure, the directional indication is only used to explain the relative positional relationship, movement conditions, etc. among the components in a specific posture (as shown in the drawings), if the specific posture changes, the directional indicator also changes accordingly.

In addition, if there are descriptions related to "first", "second", etc. in the embodiments of this disclosure, the descriptions of "first", "second", etc. are for descriptive purposes only, and cannot be understood as indicating or implying their relative importance or implicitly indicating the number of indicated technical features. Thus, the features defined as "first" and "second" may include at least one of the features either explicitly or implicitly. In addition, the technical solutions between the various embodiments can be combined with each other, but they must be based on the ability of those skilled in the art to realize. When the combination of technical solutions conflicts with each other or cannot be realized, it should be considered that the combination of such technical solutions does not exist, nor within the scope of protection required by this disclosure.

This disclosure provides an array substrate drive circuit, which is applied in display devices with display panels such as computers, mobile phones, projectors, or televisions.

Figure 5:
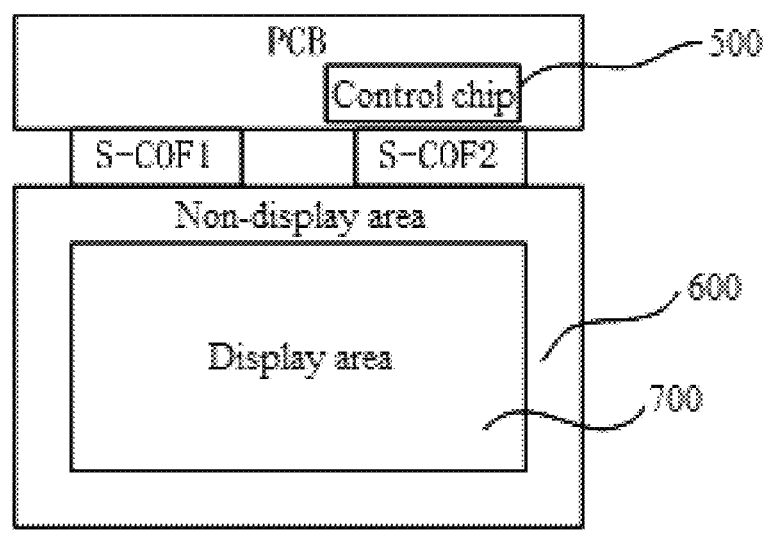
FIG. 5 is a schematic structural diagram of a display panel according to an embodiment of this disclosure.

Referring to FIGS. 1 and 5, the array substrate drive circuit includes:

a signal driver 100 configured for receiving a test signal, and generating a drive signal for driving a pixel array according to the test signal; and a signal isolator 200 configured for dividing the drive signal into an even-numbered row drive signal and an odd-numbered row drive signal for driving the pixel array according to a preset control signal to drive the pixel array in rows.

In an application scenario, the array substrate drive circuit is arranged in a non-display area 600 on opposite sides of a display panel to drive the pixel array in a display area. S-COF1 and S-COF2 represent source-level thin film drive chips, and a control chip 500 is provided on the PCB board.

In the actual production process, there are often short circuits between adjacent metal layers of the output circuit of the array substrate drive circuit caused by metal debris or other process factors. Even if the signal driver 100 itself has a fault, it cannot be detected during the test due to the short circuit.

In order to solve the above problem, after the display panel is manufactured, that is, after the array substrate drive circuit is provided on the display panel, the display panel is tested. In specific implementation, test signals are provided to the array substrate drive circuits on both sides through test points, and it is determined whether the array substrate drive circuits on both sides have output signals. If yes, it can be determined that the corresponding array substrate drive circuit to be tested can work normally; and if not, it can be determined that the array substrate drive circuit works abnormally.

According to the technical solution of this disclosure, a signal driver 100 and a signal isolator 200 are provided to form an array substrate drive circuit. The signal driver 100 generates a drive signal for driving a pixel array according to a test signal, and the signal isolator 200 divides the drive signal into an even-numbered row drive signal and an odd-numbered row drive signal for driving the pixel array according to a preset control signal. The even-numbered row drive signal and the odd-numbered row drive signal respectively drive the pixel array in rows. Since adjacent metal conductive layers will not output drive signals at the same time, even if the adjacent metal conductive layers are short-circuited, it can be detected during the test, thus improving the yield of the display panel.

Figure 2:
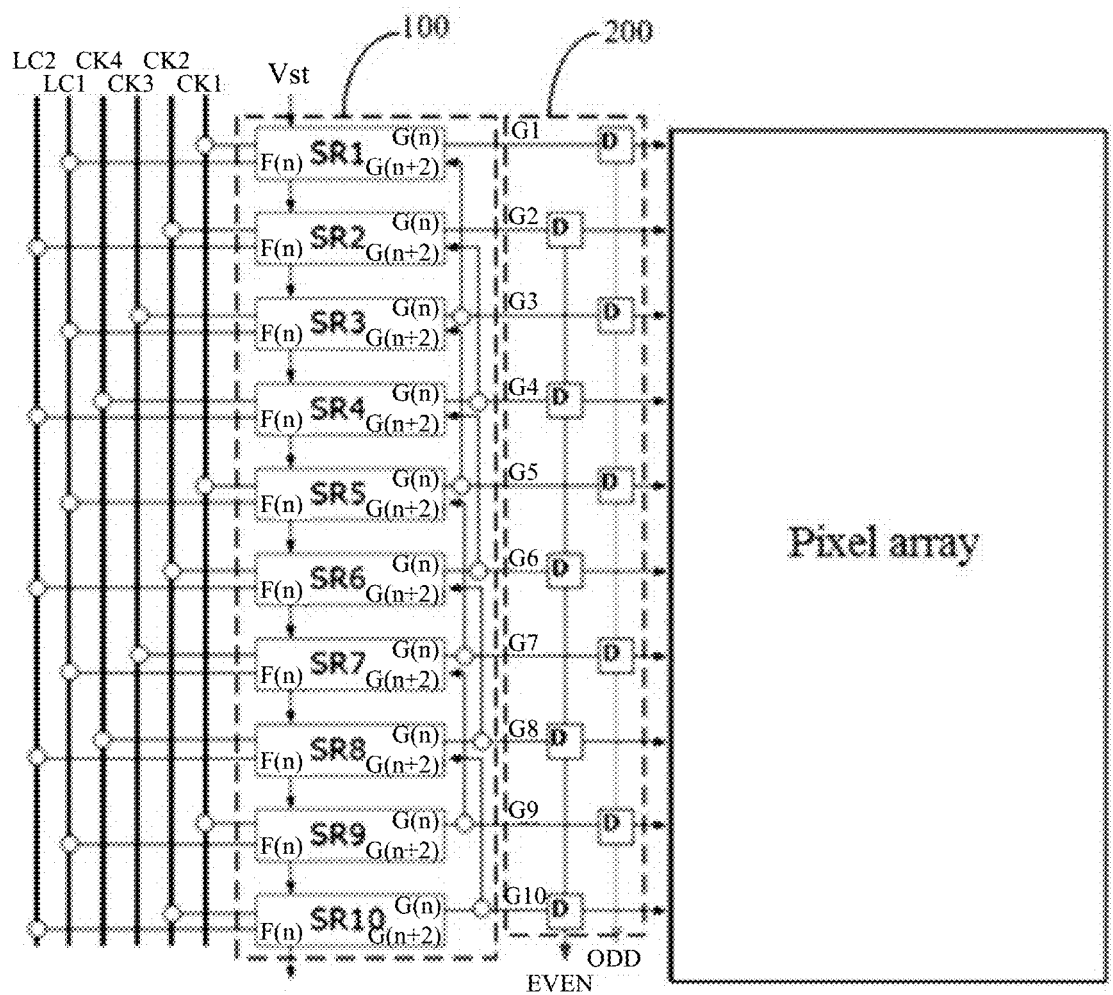
FIG. 2 is a first schematic structural diagram of the array substrate drive circuit according to an embodiment of this disclosure.

Referring to FIG. 2, the signal isolator 200 includes even-numbered row isolation circuits and odd-numbered row isolation circuits.

controlled terminals of the even-numbered row isolation circuits are connected to even-numbered row output terminals of the signal driver 100 in a one-to-one correspondence, output terminals of the even-numbered row isolation circuits are connected to even-numbered rows of the pixel array in a one-to-one correspondence, and input terminals of the even-numbered row isolation circuits are connected to each other.

controlled terminals of the odd-numbered row isolation circuits are connected to odd-numbered row output terminals of the signal driver 100 in a one-to-one correspondence, output terminals of the odd-numbered row isolation circuits are connected to odd-numbered rows of the pixel array in a one-to-one correspondence, and input terminals of the odd-numbered row isolation circuits are connected to each other.

Referring to FIG. 2, in this embodiment, the signal isolator 200 enumerates 5 even-numbered row isolation circuits and 5 odd-numbered row isolation circuits. G1, G3, G5, G7, and G9 are all odd-numbered row metal drive lines and are all configured for transmitting drive signals. G2, G4, G6, G8, and G10 are all even-numbered row metal drive lines and are all configured for transmitting drive signals.

The setting of a number of metal drive lines can be determined according to resolution of the actual pixel array, and there is no limitation.

Figure 3:
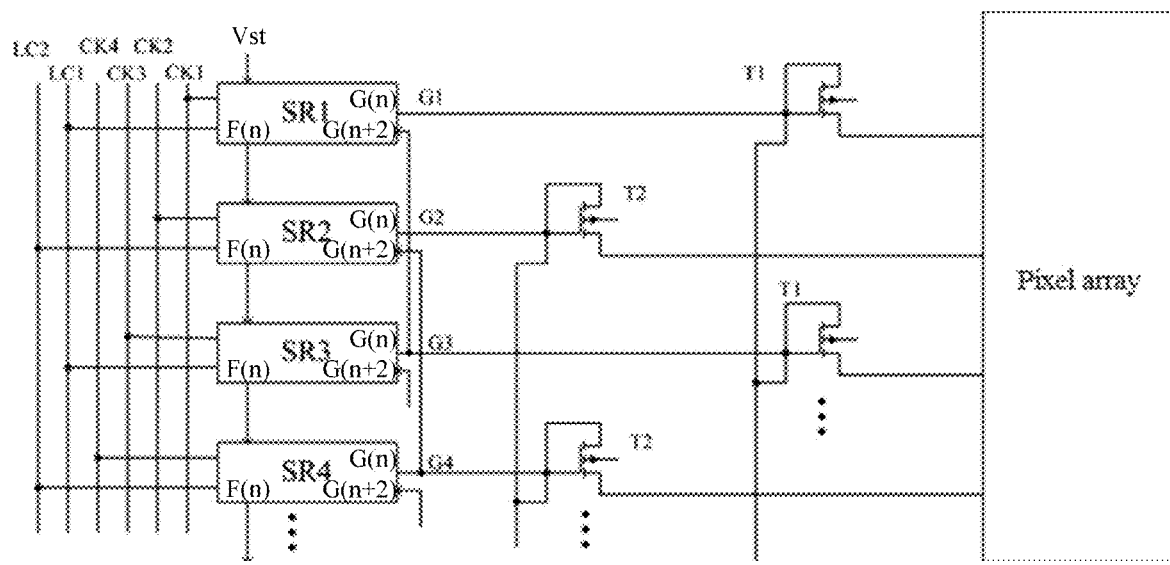
FIG. 3 is a second schematic structural diagram of the array substrate drive circuit according to an embodiment of this disclosure.

Referring to FIG. 3, each odd-numbered row isolation circuit includes a first transistor T1; a gate of the first transistor T1 is connected to a drain of the first transistor T1, the gate of the first transistor T1 is connected to a corresponding odd-numbered row output terminal of the signal driver 100, and a source of the first transistor T1 is connected to a corresponding odd-numbered row of the pixel array; the gate of the first transistor T1 is further configured for receiving the first control signal.

In this embodiment, each even-numbered row isolation circuit includes a second transistor T2; a gate of the second transistor T2 is connected to a drain of the second transistor T2, the gate of the second transistor T2 is connected to a corresponding even-numbered row output terminal of the signal driver 100, and a source of the second transistor T2 is connected to a corresponding even-numbered row of the pixel array; the gate of the second transistor T2 is further configured for receiving the second control signal.

In this embodiment, the first transistor T1 and the second transistor T2 are all thin film transistors, and both the first transistor T1 and the second transistor T2 connect their own gate and drain, that is, both of them are in a diode connect mode. When the first transistor T1 is set, its position is close to the corresponding odd-numbered row output terminal of the signal driver 100; similarly, when the second transistor T2 is set, its position is close to the corresponding even-numbered row output terminal of the signal driver 100. In this embodiment, the gate and drain of the first transistor T1 are connected as a diode to avoid back-pouring of other drive signals into the signal driver 100 due to a short circuit.

Figure 4:
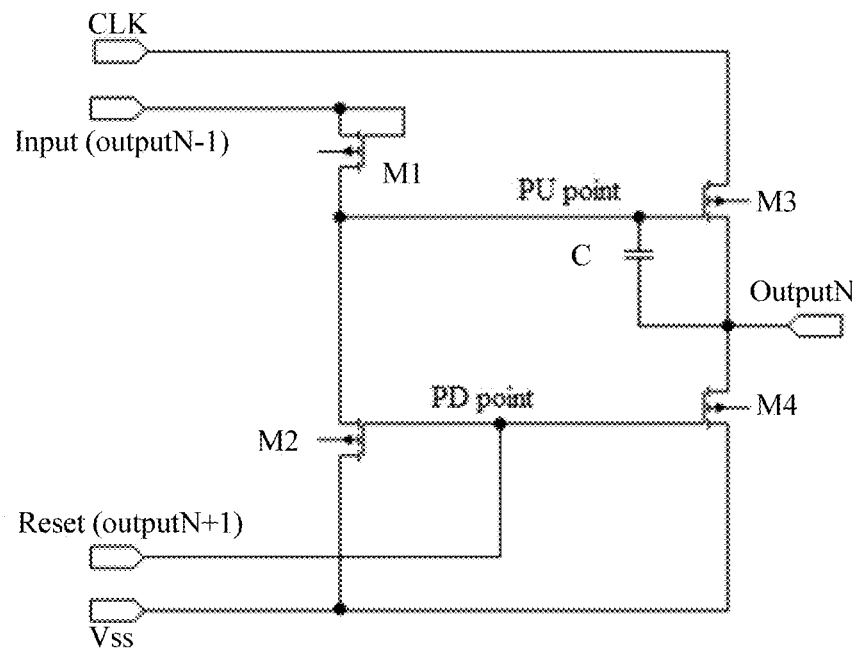
FIG. 4 is a schematic structural diagram of a drive circuit according to an embodiment of this disclosure.

Referring to FIGS. 2 and 4, the signal driver 100 includes drive circuits (SR1~SR10). Output terminals of odd-numbered row drive circuits are connected to the controlled terminals of the odd-numbered row isolation circuits in a one-to-one correspondence, and output terminals of even-numbered row drive circuits are connected to the controlled terminals of the even-numbered row isolation circuits in a one-to-one correspondence.

In this embodiment, the drive circuit is a GOA drive circuit, and the drive circuit includes voltage phase-related CK signal, LC signal and frame start signal Vst, where the CK signal includes CK1, CK2, CK3 and CK4, and the LC signal includes LC1 and LC2. The current row output signal G(n) not only drives the pixels of the current row, but also acts as a reset signal for a previous row and as an input signal for a next row. In the entire GOA drive circuit, an input signal of a first row of the GOA drive circuit is a frame start signal Vst, and the first row does not output a reset signal. The last row of the GOA drive circuit is connected to a row of redundant GOA drive circuit to realize the reset of the current row. In this way, under the action of external control signal, the rows of the GOA drive circuit also influence each other to generate displacement pulse signals, which sequentially perform progressive scanning.

In this embodiment, the GOA drive circuit may use a common 4T1C architecture, that is, 4 TFTs and 1 capacitor C, where M1 to M4 are 4 TFTs respectively.

In FIG. 4, PU point is a gate point of M3 that controls outputN to output a high level. PD point is a gate point of M4 that controls outputN to output a low level. M1 plays a precharge role for the capacitor C, that is, the input of a previous row outputN−1 pulse signal makes M1 turn on, and then precharges the PU point; and pulse signal of a next row is input to the PD point as a reset signal of this row, so that M2 and M4 are turned on, and the turned-on M2 discharges the PU point and the turned-on M4 discharges the output terminal outputN. The GOA drive circuit can be divided into several sub-units functionally, among which M1 constitutes a "charge unit", M2 and M4 constitute a "reset unit", and M3 constitutes an "output unit".

Certainly, the GOA drive circuit can also adopt other drive architectures, such as 8T1C architecture. As a common drive architecture, 8T1C architecture will not be repeated again.

Further, the preset control signal includes a first control signal EVEN and a second control signal ODD. The array substrate drive circuit further includes a control chip 500. The control chip 500 is configured for generating the first control signal EVEN or the second control signal ODD in turn according to a preset cycle, and outputting the generated first control signal EVEN or the generated second control signal ODD to the signal isolator 200.

In response to receiving the first control signal EVEN by the signal isolator 200, outputting an odd-numbered row drive signal satisfying a first preset duty ratio; and in response to receiving the second control signal ODD by the signal isolator 200, outputting an even-numbered row drive signal satisfying a second preset duty ratio.

The first control signal EVEN and the second control signal ODD are both active at high level. When the first control signal EVEN is at high level, the transistors in odd-numbered rows such as G1, G3, G5, G7 and G9 are all turned on, and when the second control signal ODD is at high level, the transistors in even-numbered rows such as G2, G4, G6, G8, and G10 are all turned on. When the first control signal EVEN is at high level, the second control signal ODD is at low level; conversely, when the first control signal EVEN is at low level, the second control signal ODD is at high level. In this way, the first control signal EVEN and the second control signal ODD are output to the signal isolator 200 in turn.

In this embodiment, the output terminals of transistors in odd-numbered rows such as G1, G3, G5, G7, and G9 and the output terminals of transistors in even-numbered rows such as G2, G4, G6, G8, and G10 are connected to a scan line in the horizontal direction of the pixel array. When the voltage of the output drive signal is higher than a certain threshold, all TFTs connected to the scan line are turned on. At this time, the pixel capacitance on the scan line is connected to the data line in the vertical direction, and the image data on the data line is written into the pixels, so as to control the transmittance of different liquid crystals to achieve the effect of color control.

Referring to FIG. 5, in order to achieve the above object, this disclosure further provides a display module, which includes:

a control chip 500, including a test signal output terminal, a first control signal output terminal and a second control signal output terminal;

a display panel, including a display area 700 and a non-display area 600, where the display area 700 includes a pixel array; and an array substrate drive circuit provided in the non-display area 600 of the display panel, where the array substrate drive circuit includes:

a signal driver 100 configured for receiving a test signal, and generating a drive signal for driving a pixel array according to the test signal; and a signal isolator 200 configured for dividing the drive signal into an even-numbered row drive signal and an odd-numbered row drive signal for driving the pixel array according to a preset control signal to drive the pixel array in rows.

It should be noted that the display panel in this embodiment may be an Organic Light-Emitting Diode (OLED) display panel or a Thin Film Transistor Liquid Crystal Display (TFT-LCD) display panel. Display panels can be divided into a System on Chip (SOC) type and a Gate Driver on Array (GOA) type according to gate driver design. GOA is a process technology that directly manufactures the gate driver IC on the array substrate of the display device to replace the drive chip made by an external silicon chip. The application of this technology can reduce production process procedures, reduce product process costs, and improve the integration of display panels. Compared with the SOC type display panel, the GOA type display panel has a narrower border. With the advancement of technology and people's higher requirements for visual effects, narrow border of display panels are the mainstream trend in the future. Therefore, the GOA type display panel is a more important application than the SOC type display panel. In an exemplary structure of the GOA display panel, Liquid Crystal (LC) molecules are filled between the upper and lower glass substrates and the surroundings are sealed with a sealing material. The liquid crystal is a polymer material and are widely used in thin and light display technology because of its special physical, chemical and optical properties.

In this embodiment, the pixel array of the display panel is composed of multiple sub-pixels, and three sub-pixels (red, green, and blue) constitute one pixel. For example, when sub-pixels on a same horizontal row are distributed on the display panel, on-time of each sub-pixel is the same. In some large-size display panels, because scan line resistances of an area of the panel far from the gate drive and an area of the panel close to the gate drive are not uniform, the sub-pixels in the same row are turned on at the same time, and time of the data signal being output to each of the sub-pixels is the same, it will inevitably lead to uneven charge of the area of the panel far from the gate drive and the area of the panel close to the gate drive, resulting in uneven brightness of the display panel. Therefore, gate drivers are often provided on left and right sides of the display panel, and frame start signal Start Vertical (STV), scan clock pulse signal Clock Pulse Vertical (CPV), clock signals CK1~CKx, low-frequency signals LC1 & LC2 and other GOA drive signals are output through the control chip to the GOA circuits (that is, the array substrate drive circuits 200) on the left and right sides of the panel. After the GOA circuit operates normally, the gate lines in the display panel are turned on row by row to realize bilateral drive.

In some embodiments, the array substrate drive circuit is further provided with a source driver. The source driver is configured for inputting the data signal. The source driver is installed on the drive board PCB. The source driver is connected to the control chip. Multiple output terminals of the source driver are respectively connected to corresponding data lines of the pixel array. The control chip receives data signal, control signal and clock signal output by external circuit sub-units, such as a control system SOC of a television, and converts them into data signal, control signal and clock signal suitable for the array substrate drive circuit 200 and the source driver. The source driver outputs the data signal to the corresponding pixel through the data line to realize the image display of the display panel. A number of the source driver is multiple, which can be specifically set according to the size of the display panel.

In the technical solution of this disclosure, the signal isolator 200 divides the drive signal into an even-numbered row drive signal and an odd-numbered row drive signal for driving the pixel array according to a preset control signal. The even-numbered row drive signal and the odd-numbered row drive signal respectively drive the pixel array in rows. Since adjacent metal conductive layers will not output drive signals at the same time, even if the adjacent metal conductive layers are short-circuited, it can be detected during the test, thus improving the yield of the display panel.

This disclosure further provides a display device including the above-mentioned display module. For the detailed structure of the display module, please refer to the above-mentioned embodiments, which will not be repeated here. It is understandable that since the above-mentioned display module is included in the display device of this disclosure, the embodiments of the display device of this disclosure includes all the technical solutions of the above-mentioned display module, and the achieved technical effects are also completely the same, which will not be repeated here.

The display device can be a television, an electronic billboard, etc.

The above are only the preferred embodiments of this disclosure, and therefore do not limit the patent scope of this disclosure. Under the conception of this disclosure, any equivalent structural transformation made by using the content of the description and drawings of this disclosure, or direct/indirect application in other related technical fields are all included in the patent protection scope of this disclosure.

What is claimed is:

1. An array substrate drive circuit, comprising:
a signal driver configured for receiving a test signal, and generating a drive signal for driving a pixel array according to the test signal; and
a signal isolator configured for dividing the drive signal into an even-numbered row drive signal and an odd-numbered row drive signal for driving the pixel array according to a preset control signal to drive the pixel array in rows;
wherein the signal isolator comprises even-numbered row isolation circuits and odd- numbered row isolation circuits;
controlled terminals of the even-numbered row isolation circuits are connected to even- numbered row output terminals of the signal driver in a one-to-one correspondence, output terminals of the even-numbered row isolation circuits are connected to even-numbered rows of the pixel array in a one-to-one correspondence, and input terminals of the even-numbered row isolation circuits are connected to each other; and controlled terminals of the odd-numbered row isolation circuits are connected to odd-numbered row output terminals of the signal driver in a one-to-one correspondence, output terminals of the odd-numbered row isolation circuits are connected to odd-numbered rows of the pixel array in a one-to-one correspondence, and input terminals of the odd-numbered row isolation circuits are connected to each other;

wherein the preset control signal comprises a first control signal and a second control signal; each odd-numbered row isolation circuit comprises a first transistor; a gate of the first transistor is connected to a drain of the first transistor, the gate of the first transistor is connected to a corresponding odd-numbered row output terminal of the signal driver, and a source of the first transistor is connected to a corresponding odd-numbered row of the pixel array; the gate of the first transistor is configured for receiving the first control signal.

2. The array substrate drive circuit of claim 1, wherein each even-numbered row isolation circuit comprises a second transistor; a gate of the second transistor is connected to a drain of the second transistor, the gate of the second transistor is connected to a corresponding even-numbered row output terminal of the signal driver, and a source of the second transistor is connected to a corresponding even-numbered row of the pixel array; the gate of the second transistor is configured for receiving the second control signal.

3. The array substrate drive circuit of claim 2, wherein the first transistor and the second transistor are thin film transistors.

4. The array substrate drive circuit of claim 3, wherein the signal driver comprises drive circuits, output terminals of odd-numbered row drive circuits are connected to the controlled terminals of the odd-numbered row isolation circuits in a one-to-one correspondence, and output terminals of even-numbered row drive circuits are connected to the controlled terminals of the even-numbered row isolation circuits in a one-to-one correspondence.

5. The array substrate drive circuit of claim 3, wherein the signal isolator is configured for receiving a first control signal and a second control signal;
in response to receiving the first control signal by the signal isolator, outputting an odd-numbered row drive signal satisfying a first preset duty ratio; and
in response to receiving the second control signal by the signal isolator, outputting an even-numbered row drive signal satisfying a second preset duty ratio.

6. The array substrate drive circuit of claim 2, wherein the signal driver comprises drive circuits, output terminals of odd-numbered row drive circuits are connected to the controlled terminals of the odd-numbered row isolation circuits in a one-to-one correspondence, and output terminals of even-numbered row drive circuits are connected to the controlled terminals of the even-numbered row isolation circuits in a one-to-one correspondence.

7. The array substrate drive circuit of claim 2, wherein the signal isolator is configured for receiving a first control signal and a second control signal;
in response to receiving the first control signal by the signal isolator, outputting an odd-numbered row drive signal satisfying a first preset duty ratio; and
in response to receiving the second control signal by the signal isolator, outputting an even-numbered row drive signal satisfying a second preset duty ratio.

8. The array substrate drive circuit of claim 1, wherein the signal driver comprises drive circuits, output terminals of odd-numbered row drive circuits are connected to the controlled terminals of the odd-numbered row isolation circuits in a one-to-one correspondence, and output terminals of even-numbered row drive circuits are connected to the controlled terminals of the even-numbered row isolation circuits in a one-to-one correspondence.

9. The array substrate drive circuit of claim 1, wherein the signal isolator is configured for receiving a first control signal and a second control signal; in response to receiving the first control signal by the signal isolator, outputting an odd-numbered row drive signal satisfying a first preset duty ratio; and in response to receiving the second control signal by the signal isolator, outputting an even-numbered row drive signal satisfying a second preset duty ratio.

10. The array substrate drive circuit of claim 1, wherein the signal driver comprises drive circuits, output terminals of odd-numbered row drive circuits are connected to the controlled terminals of the odd-numbered row isolation circuits in a one-to-one correspondence, and output terminals of even-numbered row drive circuits are connected to the controlled terminals of the even-numbered row isolation circuits in a one-to-one correspondence.

11. The array substrate drive circuit of claim 10, wherein the drive circuits are gate driven on array drive circuits, and the drive circuit comprise a voltage phase-related CK signal, a LC signal and a frame start signal Vst, wherein the CK signal comprises CK1, CK2, CK3 and CK4, and the LC signal comprises LC1 and LC2.

12. The array substrate drive circuit of claim 11, wherein each gate driven on array drive circuit comprises 4 thin film transistors and 1 capacitor C.

13. The array substrate drive circuit of claim 1, wherein the signal isolator is configured for receiving a first control signal and a second control signal;
in response to receiving the first control signal by the signal isolator, outputting an odd-numbered row drive signal satisfying a first preset duty ratio; and
in response to receiving the second control signal by the signal isolator, outputting an even-numbered row drive signal satisfying a second preset duty ratio.

14. The array substrate drive circuit of claim 13, further comprising a control chip;
wherein the control chip is configured for generating the first control signal or the second control signal in turn according to a preset cycle, and outputting the first control signal or the second control signal to the signal isolator.

15. A display module, comprising:
a control chip, comprising a test signal output terminal, a first control signal output terminal and a second control signal output terminal;
a display panel, comprising a display area and a non-display area, wherein the display area comprises a pixel array; and
the array substrate drive circuit as recited in claim 1, wherein the array substrate drive circuit is provided in the non-display area of the display panel.

16. The display module of claim 15, wherein the display panel is an organic light-emitting diode display panel or a thin film transistor liquid crystal display panel.

17. A display device, comprising the display module as recited in claim 15.

* * * * *